United States Patent
Ishii et al.

(10) Patent No.: US 9,748,920 B2
(45) Date of Patent: Aug. 29, 2017

(54) RESONATOR ELEMENT, RESONATOR, ELECTRONIC DEVICE, ELECTRONIC APPARATUS, AND MOVING OBJECT

(71) Applicant: Seiko Epson Corporation, Tokyo (JP)

(72) Inventors: Osamu Ishii, Tatsuno (JP); Yusuke Sugimoto, Suwa (JP)

(73) Assignee: Seiko Epson Corporation (JP)

( * ) Notice: Subject to any disclaimer, the term of this patent is extended or adjusted under 35 U.S.C. 154(b) by 485 days.

(21) Appl. No.: 14/526,970

(22) Filed: Oct. 29, 2014

(65) Prior Publication Data

US 2015/0115772 A1   Apr. 30, 2015

(30) Foreign Application Priority Data

Oct. 30, 2013   (JP) ................................. 2013-225044

(51) Int. Cl.
| | |
|---|---|
| H01L 41/047 | (2006.01) |
| H03B 5/32 | (2006.01) |
| H03H 9/17 | (2006.01) |
| H03H 9/02 | (2006.01) |
| H03H 9/19 | (2006.01) |
| H03H 9/13 | (2006.01) |
| H03H 9/10 | (2006.01) |
| H03H 9/05 | (2006.01) |

(52) U.S. Cl.
CPC ............ *H03H 9/19* (2013.01); *H03H 9/1021* (2013.01); *H03H 9/132* (2013.01); *H03H 9/171* (2013.01); *H03H 9/177* (2013.01); *H03H 9/0542* (2013.01)

(58) Field of Classification Search
CPC .................................. H04R 17/00; H03B 5/32
USPC ................ 310/322, 333, 361, 364; 333/187; 331/107 R, 116 R, 154, 158
See application file for complete search history.

(56) References Cited

U.S. PATENT DOCUMENTS

| | | | |
|---|---|---|---|
| 5,126,695 A | | 6/1992 | Abe |
| 5,369,377 A | | 11/1994 | Benhamida |
| 5,517,109 A | | 5/1996 | Albean et al. |
| 6,492,759 B1 | * | 12/2002 | Watanabe .......... H03H 9/02086 310/320 |
| 6,617,756 B1 | | 9/2003 | Uchiyama |
| 6,621,362 B2 | | 9/2003 | Momtaz et al. |
| 6,782,485 B2 | | 8/2004 | Takai |
| 6,819,195 B1 | | 11/2004 | Blanchard et al. |

(Continued)

FOREIGN PATENT DOCUMENTS

| | | |
|---|---|---|
| JP | 02-261210 | 10/1990 |
| JP | 7-046072 A | 2/1995 |

(Continued)

OTHER PUBLICATIONS

U.S. Appl. No. 14/525,568, filed Oct. 28, 2014, Takehiro Yamamoto et al.

*Primary Examiner* — Thomas Dougherty
(74) *Attorney, Agent, or Firm* — Harness, Dickey & Pierce, P.L.C.

(57) ABSTRACT

A resonator element includes a vibrating portion that vibrates in a thickness shear vibration and includes a first main surface and a second main surface which are in a front and back relationship to each other, a first excitation electrode that is provided on the first main surface, and a second excitation electrode that is provided on the second main surface, and an energy trapping coefficient M satisfies a relationship of $33.6 \leq M \leq 65.1$.

10 Claims, 16 Drawing Sheets

| RESONANT FREQUENCY [MHz] | hx [mm] | hz [mm] | hx/hz | Au [nm] | Ni [nm] | TRAPPING COEFFICIENT M | CI [Ω] | SPURIOUS RATIO [CIs/CIm] |
|---|---|---|---|---|---|---|---|---|
| 491 | 0.18 | 0.14 | 1.29 | 30 | 7 | 18.9 | 32.0 | 4.7 |
| | | | | 45 | 7 | 25.9 | 26.0 | 3.7 |
| | | | | 60 | 7 | 33.9 | 20.0 | 3.0 |
| | | | | 75 | 7 | 43.4 | 15.9 | 2.5 |
| | | | | 90 | 7 | 55.2 | 16.0 | 1.6 |
| | | | | 95 | 7 | 59.6 | 18.0 | 1.2 |
| | | | | 100 | 7 | 64.7 | 22.0 | 1.1 |

(56) References Cited

U.S. PATENT DOCUMENTS

| | | |
|---|---|---|
| 7,129,624 B2 | 10/2006 | Umeki et al. |
| 7,221,234 B2 | 5/2007 | Chien |
| 7,259,638 B2 | 8/2007 | Takahashi |
| 7,463,097 B2 | 12/2008 | Costa et al. |
| 7,471,164 B2 | 12/2008 | Reimann |
| 7,646,257 B2 | 1/2010 | Gailus et al. |
| 7,714,674 B2 | 5/2010 | Guo et al. |
| 7,768,357 B2 | 8/2010 | Yamakawa |
| 7,795,982 B2 | 9/2010 | Yamamoto |
| 7,821,348 B2 | 10/2010 | Ishimaru et al. |
| 7,978,016 B2 | 7/2011 | Naito |
| 8,031,025 B2 | 10/2011 | Wang et al. |
| 8,143,961 B2 | 3/2012 | Mastovich |
| 8,164,159 B1 | 4/2012 | Armstrong et al. |
| 8,253,506 B2 | 8/2012 | Liu et al. |
| 8,368,472 B2 | 2/2013 | Nakamura et al. |
| 8,461,934 B1 | 6/2013 | Carnu et al. |
| 9,013,242 B2 * | 4/2015 | Ishii .................. H03H 9/02102 310/365 |
| 2002/0171499 A1 | 11/2002 | Momtaz et al. |
| 2003/0227341 A1 | 12/2003 | Sawada |
| 2004/0056725 A1 | 3/2004 | Kitamura et al. |
| 2006/0049878 A1 | 3/2006 | Kawabe et al. |
| 2007/0075798 A1 | 4/2007 | Amano |
| 2007/0132524 A1 | 6/2007 | Kishino |
| 2008/0001678 A1 | 1/2008 | Otsuka |
| 2008/0191756 A1 | 8/2008 | Li et al. |
| 2009/0039970 A1 | 2/2009 | Shen et al. |
| 2009/0115542 A1 | 5/2009 | Nakamura et al. |
| 2009/0256449 A1 | 10/2009 | Nishimura et al. |
| 2010/0171557 A1 | 7/2010 | Tsukizawa |
| 2012/0126907 A1 | 5/2012 | Nakamoto et al. |
| 2012/0176763 A1 | 7/2012 | Asamura |
| 2013/0043959 A1 * | 2/2013 | Ishii .................... H03H 9/0542 331/158 |
| 2013/0154754 A1 | 6/2013 | Frank |
| 2013/0257553 A1 * | 10/2013 | Ishii .................. H03H 9/02102 331/158 |
| 2013/0257554 A1 * | 10/2013 | Ishii ........................ H03B 5/32 331/158 |
| 2014/0132362 A1 | 5/2014 | Hsiao |
| 2014/0210565 A1 | 7/2014 | Vilas Boas et al. |
| 2015/0115772 A1 * | 4/2015 | Ishii ....................... H03H 9/132 310/318 |
| 2015/0116044 A1 | 4/2015 | Itasaka et al. |
| 2015/0116051 A1 | 4/2015 | Terrovitis |

FOREIGN PATENT DOCUMENTS

| | | |
|---|---|---|
| JP | 07-249957 | 9/1995 |
| JP | 11-284484 A | 10/1999 |
| JP | 2000-278079 A | 10/2000 |
| JP | 2001-007648 A | 1/2001 |
| JP | 2001-094347 A | 4/2001 |
| JP | 2001-102870 A | 4/2001 |
| JP | 2002-299991 A | 10/2002 |
| JP | 2004-120293 A | 4/2004 |
| JP | 2004-214799 A | 7/2004 |
| JP | 2004-328505 A | 11/2004 |
| JP | 2005-051513 A | 2/2005 |
| JP | 2005-203858 A | 7/2005 |
| JP | 2009-044606 A | 2/2009 |
| JP | 2009-164691 A | 7/2009 |
| JP | 2009-201097 A | 9/2009 |
| JP | 2009-253883 A | 10/2009 |
| JP | 2010-050508 A | 3/2010 |
| JP | 2010-062959 A | 3/2010 |
| JP | 2010-074840 A | 4/2010 |
| JP | 2013-098678 A | 5/2013 |
| JP | 2013-207337 A | 10/2013 |
| JP | 2014-154994 A | 8/2014 |

* cited by examiner

| RESONANT FREQUENCY [MHz] | hx [mm] | hz [mm] | hx/hz | Au [nm] | Ni [nm] | TRAPPING COEFFICIENT M | CI [Ω] | SPURIOUS RATIO [CIs/CIm] |
|---|---|---|---|---|---|---|---|---|
| 491 | 0.18 | 0.14 | 1.29 | 30 | 7 | 18.9 | 32.0 | 4.7 |
| | | | | 45 | 7 | 25.9 | 26.0 | 3.7 |
| | | | | 60 | 7 | 33.9 | 20.0 | 3.0 |
| | | | | 75 | 7 | 43.4 | 15.9 | 2.5 |
| | | | | 90 | 7 | 55.2 | 16.0 | 1.6 |
| | | | | 95 | 7 | 59.6 | 18.0 | 1.2 |
| | | | | 100 | 7 | 64.7 | 22.0 | 1.1 |

FIG. 4

RESONATOR ELEMENT, RESONATOR, ELECTRONIC DEVICE, ELECTRONIC APPARATUS, AND MOVING OBJECT

BACKGROUND

1. Technical Field

The present invention relates to a resonator element, a resonator, an electronic device, an electronic apparatus, and a moving object.

2. Related Art

Since an AT cut quartz crystal resonator that vibrates in thickness shear vibration as a vibration mode of main vibration is suitable for miniaturization and increasing a frequency and has an excellent frequency-temperature characteristic, it has been used in an oscillator and an electronic apparatus. Particularly, in recent years, as the processing speed of transmission communication equipment or OA equipment is increased or the volume of communication data and the processing capacity are increased, there has been a strong request for increasing a frequency for the AT cut quartz crystal resonator which is a reference frequency signal source used therein.

Generally, since a resonant frequency and the thickness of a quartz crystal plate have an inverse relationship in the AT cut quartz crystal resonator using the thickness shear vibration as main vibration, it is possible to increase the frequency by reducing the thickness of the quartz crystal plate.

JP-A-11-284484 discloses an AT cut quartz crystal resonator of a so-called reverse mesa structure in which a concave portion is formed in a part of a main surface of a quartz crystal plate so as to reduce the film thickness of a vibration region and increase the frequency. It is described that a good frequency-temperature characteristic is obtained by setting the ratio between the plate thickness of the vibration region of the quartz crystal plate and the film thickness obtained by converting the electrode formed on the front and back of the vibration region into a quartz crystal density to a range of 7% to 13%, in the AT cut quartz crystal resonator in which a fundamental wave vibration vibrates at a resonant frequency of 300 MHz or more.

In addition, similarly to JP-A-11-284484, JP-A-2005-203858 discloses an AT cut quartz crystal resonator of a reverse mesa structure in which a fundamental wave vibration vibrates at a resonant frequency of 300 MHz or more. In the AT cut quartz crystal resonator, it is possible to prevent a frequency change before and after reflow, and a change in a frequency-temperature characteristic, by setting the ratio between the plate thickness of the vibration region of a quartz crystal plate and the electrode thickness on one side of the electrodes formed on the front and back of the vibration region to be 0.014 or less or 0.012 or less (the ratio between the plate thickness of the vibration region of the quartz crystal plate and the film thickness obtained by converting the electrode film thickness into a quartz crystal density is 19.2% or less or 16.5% or less).

However, note that if the resonant frequency of the fundamental wave vibration is increased, especially, if the resonant frequency is set to 200 MHz or more, there is a problem that it is necessary to reduce a CI (quartz crystal impedance=equivalent resistance of the quartz crystal resonator) value in order to drive the quartz crystal resonator at the resonant frequency of the fundamental wave vibration, in the oscillation circuit equipped with the quartz crystal resonator having the above-described structure. Especially, if the resonant frequency is set to a high frequency of 200 MHz or more, the film thickness of the excitation electrode and the lead electrode which are formed on the quartz crystal plate significantly affects the CI value of the main vibration. If a mode of trapping only the main vibration of the quartz crystal resonator is set, it is necessary to reduce the thickness of the electrode film; whereas if the thickness of the electrode film is set to 100 nm or less, a sheet resistance is rapidly increased, such that a large ohmic loss (resistance loss due to surface resistance) occurs at the excitation electrode portion and the lead electrode portion, this results in a problem of the CI value of the quartz crystal resonator being increased.

However, if the thickness of the electrode is increased in order to reduce the ohmic loss of the electrode film, spurious vibration is generated by the vibrations of many in-harmonic modes being trapped in addition to the main vibration, the CI value of spurious vibration close to the main vibration becomes smaller than the CI value of the main vibration depending on conditions, and thus there is a problem of the oscillation circuit oscillating at the resonant frequency of the spurious vibration.

SUMMARY

An advantage of some aspects of the invention is to solve at least a part of the problems described above, and the invention can be implemented as the following forms or application examples.

Application Example 1

This application example is directed to a resonator element including a vibrating portion that vibrates in a thickness shear vibration and includes a first main surface and a second main surface which are in a front and back relationship to each other; a first excitation electrode that is provided on the first main surface; and a second excitation electrode that is provided on the second main surface, an energy trapping coefficient M, a frequency decrease amount $\Delta$, a cut-off frequency fs, and a frequency fe satisfy relationships of $33.6 \leq M \leq 65.1$, $M = K \times (hx/2 \times ts) \times \sqrt{\Delta}$, $\Delta = (fs-fe)/fs$, $fs = R/ts$, and $fe = R/[ts + te \times (\rho e/\rho x)]$, where M is an energy trapping coefficient, K is an anisotropy coefficient of the vibrating portion, hx is a length along the thickness shear vibration direction of the first excitation electrode and the second excitation electrode, ts a thickness of the vibrating portion, $\Delta$ is a frequency decrease amount, fs is a cut-off frequency of the vibrating portion, fe is a frequency when the first excitation electrode and the second excitation electrode are disposed in the vibrating portion, R is a frequency integer of the vibrating portion, te is a sum of the thicknesses of the first excitation electrode and the second excitation electrode, $\rho e$ is densities of the first excitation electrode and the second excitation electrode, and $\rho x$ is a density of the vibrating portion.

According to this application example, in the resonator element of a high frequency that is excited in the thickness shear vibration mode of a fundamental wave, since the energy trapping coefficient M satisfies the relationship of $33.6 \leq M \leq 65.1$, it is possible to reduce the CI value degradation due to an influence of an ohmic loss caused by reducing the thickness of the excitation electrode. Furthermore, since it is possible to efficiently trap the vibration energy in the region of the excitation electrode, there is an effect of setting the CI value of the main vibration to be 20Ω or less and facilitating the oscillation by the oscillation circuit.

Application Example 2

This application example is directed to the resonator element according to the application example described above, wherein the energy trapping coefficient M satisfies a relationship of 33.6≤M≤46.7.

According to this application example, in the resonator element of a high frequency that is excited in the thickness shear vibration mode of a fundamental wave, since the energy trapping coefficient M satisfies the relationship of 33.6≤M≤46.7, there is an effect of obtaining the resonator element having a great ratio between a CIm value of the main vibration and a CIs value of the spurious vibration close thereto, that is, a CI value ratio (CIs/CIm).

Further, it is possible to reduce the CI value degradation due to an influence of an ohmic loss caused by reducing the thickness of the excitation electrode.

Furthermore, it is possible to reduce the excitation intensity of the spurious vibration of the inharmonic modes that are determined by the dimensions and film thickness of the excitation electrode.

Thus, for example, it is possible to reduce the CI value of the main vibration to be 20Ω or less.

Application Example 3

This application example is directed to the resonator element according to the application example described above, wherein the vibrating portion is a quartz crystal substrate.

According to this application example, there is an effect of obtaining a resonator element having a high Q value.

Application Example 4

This application example is directed to the resonator element according to the application example described above, wherein the quartz crystal substrate is an AT cut quartz crystal substrate.

According to this application example, there is an effect capable of obtaining the resonator element which has a small CI value and has an excellent temperature characteristic, because the resonator element has a cutting angle with an excellent temperature characteristic.

Further, there is an effect capable of providing the resonator element which has an excellent temperature characteristic, by using the AT cut quartz crystal substrate as the vibrating portion.

Application Example 5

This application example is directed to the resonator element according to the application example described above, wherein when the length along the direction orthogonal to the thickness shear vibration direction of the first excitation electrode and the second excitation electrode is set to hz, a relationship of 1.25≤hx/hz≤1.31 is satisfied.

According to this application example, when a substrate, in which the displacement distribution of the displacement direction determined by the anisotropy of the crystal and the displacement distribution in the direction perpendicular thereto are different, is used as the vibrating portion, it is possible to increase the efficiency of energy trapping of the main vibration.

Further, there is an effect of reducing the capacitance ratio γ of the resonator element (=C0/C1, here, C0 is a parallel capacitance, and C1 is an equivalent serial capacitance).

Application Example 6

This application example is directed to the resonator element according to the application example described above, wherein the first excitation electrode and the second excitation electrode are respectively formed of a two-layer structure in which a first layer and a second layer are laminated in this order from the vibrating portion side, the first layer includes nickel (Ni) and the second layer includes gold (Au).

According to this application example, since a structure is used in which the first layer includes nickel (Ni) is provided between the vibrating portion and the second layer including gold (Au), it is possible to increase the adhesion between the vibrating portion and the second layer including gold (Au). Further, there is an effect of obtaining a resonator element with highly reliable evaluation, because the second layer including gold (Au) is only slightly affected by oxidation or the like and is very stable.

Application Example 7

This application example is directed to a resonator including the resonator element according to the application example described above, and a package accommodating the resonator element.

According to this application example, since the resonator element is accommodated in the package, a resonator with highly reliable quality is obtained.

For example, since it is possible to prevent an influence of disturbance such as a temperature change or a humidity change and an influence of contamination, there is an effect of obtaining a resonator which has an excellent frequency reproducibility, a frequency-temperature characteristic, a CI-temperature characteristic, and a frequency aging characteristic.

Application Example 8

This application example is directed to an electronic device including the resonator element according to the application example described above, and a circuit.

According to this application example, if the electronic device is formed by using the resonator element of a high frequency that is excited at a fundamental wave, the capacitance ratio of the resonator element is small, such that there is an effect of obtaining an electronic device that has a wide frequency variable width and a good S/N ratio.

Application Example 9

This application example is directed to an electronic apparatus including the resonator element according to the application example described above.

According to this application example, there is an effect capable of configuring an electronic apparatus including a reference frequency source that has an excellent frequency stability at high frequencies and has a good S/N ratio, by using the resonator element described in the application example in an electronic apparatus.

Application Example 10

This application example is directed to a moving object including the resonator element according to the application example described above.

According to this application example, it is possible to obtain a highly reliable moving object including a reference frequency source that has excellent frequency stability at high frequencies and has a good S/N ratio, by using the resonator element described in the application example in an electronic apparatus.

BRIEF DESCRIPTION OF THE DRAWINGS

The invention will be described with reference to the accompanying drawings, wherein like numbers reference like elements.

FIG. 1A is a plan view, FIG. 1B is a sectional view taken along line A-A, and FIG. 1C is a sectional view taken along line B-B.

FIG. 4 is a diagram illustrating an experimental production condition of a resonator element and a characteristic result of a resonator.

FIG. 7A is a plan view of Modification Example 1, FIG. 7B is a plan view of Modification Example 2, and FIG. 7C is a plan view of Modification Example 3.

FIG. 8A is a plan view of Modification Example 1, and FIG. 8B is a sectional view taken along line C-C of Modification Example 1.

FIG. 9A is a plan view of Modification Example 2, and FIG. 9B is a sectional view taken along line D-D of Modification Example 2.

FIG. 10A is a plan view of Modification Example 3, and FIG. 10B is a sectional view taken along line E-E of Modification Example 3.

FIG. 11A is a plan view of Modification Example 4, and FIG. 11B is a sectional view taken along line F-F of Modification Example 4.

FIG. 12A is a plan view of Modification Example 5, and FIG. 12B is a sectional view taken along line G-G of Modification Example 5.

FIG. 13A is a plan view, and FIG. 13B is a longitudinal sectional view.

FIG. 14A is a plan view, and FIG. 14B is a longitudinal sectional view.

DESCRIPTION OF EXEMPLARY EMBODIMENTS

Figures 1A, 1B, 1C:
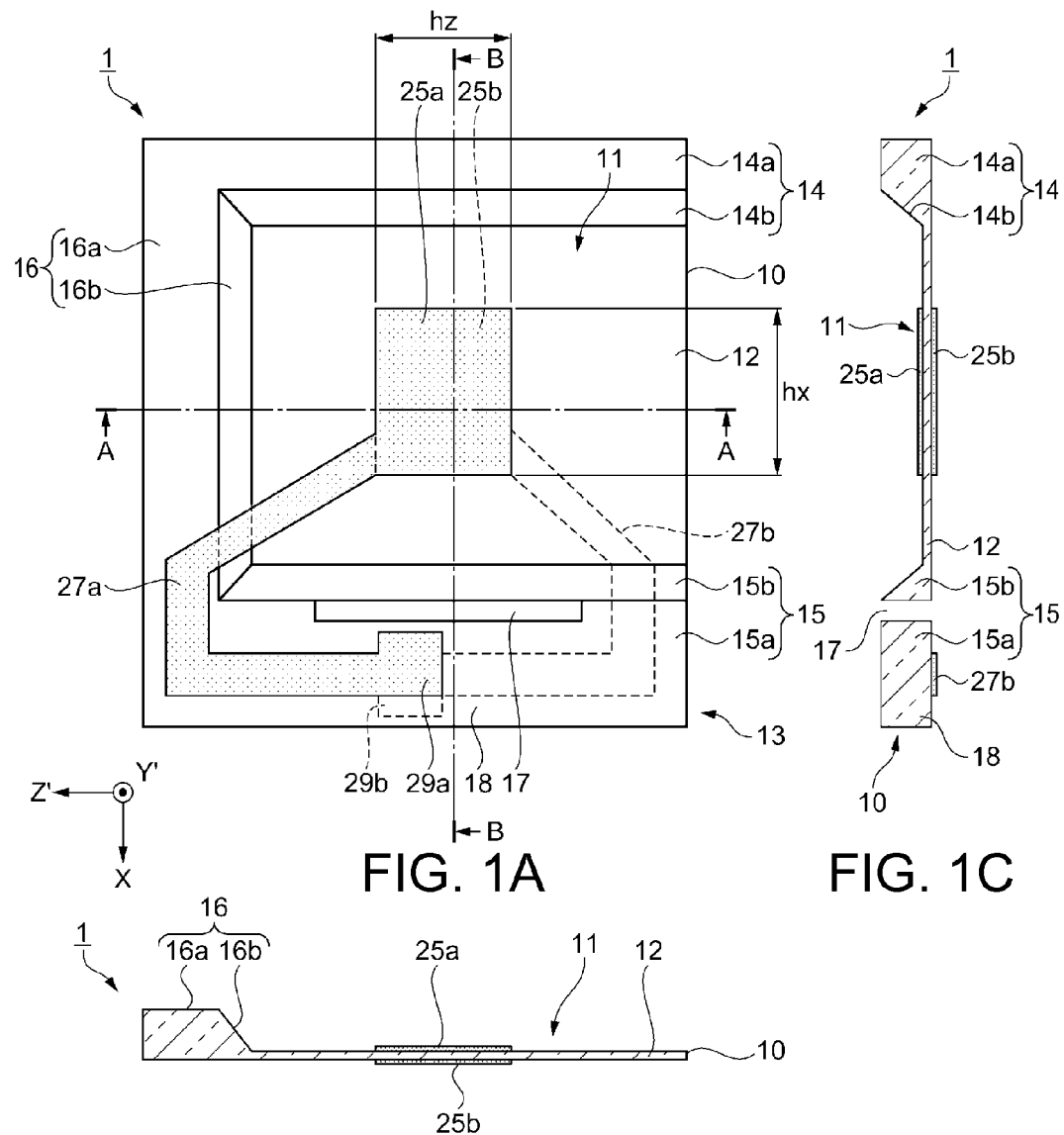
FIGS. 1A to 1C are schematic diagrams illustrating a configuration of a resonator element according to an embodiment of the invention.

Hereinafter, a resonator element, a resonator, an electronic device, an electronic apparatus, and a moving object according to the invention will be described based on preferred embodiments illustrated in the drawings.

Resonator Element

First, a resonator element 1 according to an embodiment of the invention will be described.

FIGS. 1A to 1C are schematic diagrams illustrating a configuration of a resonator element according to an embodiment of the invention, FIG. 1A is a plan view of the resonator element, FIG. 1B is a sectional view taken along line A-A of FIG. 1A, and FIG. 1C is a sectional view taken along line B-B of FIG. 1A.

The resonator element 1 includes a substrate 10 having a vibrating portion 12 and a supporting portion 18 that is a thick portion 13 which is provided continuously to the vibrating portion 12 and is thicker than the thickness of the vibrating portion 12, first and second excitation electrodes 25a and 25b which are formed on both main surfaces (front and back surfaces in ±Y' directions) of the vibrating portion 12 so as to be opposed to each other and overlapped in a plan view, pad electrodes 29a and 29b provided in the thick portion, and lead electrodes 27a and 27b which are formed so as to respectively extend from the first excitation electrode 25a and the second excitation electrode 25b toward the pad electrodes 29a and 29b.

The substrate 10 forms a rectangular shape and includes a vibrating portion 12 which is thin and has a flat plate shape of a constant thickness orthogonal to a Y' axis, a thick portion 13 formed of a first thick portion 14, a second thick portion 15 which is a supporting portion 18, and a third thick portion 16 (also referred to as first, second, and third thick portions 14, 15, and 16) which are respectively integrated into three sides of the vibrating portion 12 except for one side thereof, and a slit 17 for reducing the propagation of mounting stress caused at the time of supporting and fixing to the vibrating portion 12.

In addition, a first thick main body 14a, a second thick main body 15a, and a third thick main body 16a (also referred to as first, second, and third thick main bodies 14a, 15a, and 16a) refer to regions that are parallel to the Y' axis and have a constant thickness.

Further, a first inclined portion 14b, a second inclined portion 15b, and a third inclined portion 16b (also referred to as first, second, and third inclined portions 14b, 15b, and 16b) refer to inclined surfaces that are formed between the first, second and third thick main bodies 14a, 15a, and 16a and the vibrating portion 12.

One main surface of the vibrating portion 12 and one surface of each of the first, second and third thick portions 14, 15, and 16 are located on the same plane, that is, on an X-Z' plane of coordinate axes illustrated in FIGS. 1A to 1C, this surface (a lower surface located in a −Y' direction of FIG. 1B) is referred to as a flat surface, and a surface on the opposite side having a concave portion 11 (an upper surface located in a +Y' direction of FIG. 1B) is referred to as a concave surface.

The first excitation electrode 25a and the second excitation electrode 25b have a rectangular shape (a long side is in the X-axis direction) in the resonator element 1 illustrated in FIGS. 1A to 1C, and oppose each other so as to overlap in a plan view on front and rear surfaces (both surfaces including an upper surface and a lower surface) at a substantially center part of the vibrating portion 12, the first excitation electrode 25a is formed on one main surface which is a first main surface, and the second excitation electrode 25b is formed on the other main surface which is a second main surface.

The lead electrode 27a extends from the first excitation electrode 25a formed on the first main surface which is the concave surface and is conductively connected to the pad electrode 29a formed on the concave surface of the second thick main body 15a which is the supporting portion 18 through the third inclined portion 16b and the third thick main body 16a from the top of the vibrating portion 12.

Further, the lead electrode 27b extends from the second excitation electrode 25b formed on the second main surface which is the flat surface and is conductively connected to the pad electrode 29b formed on the flat surface of the second thick main body 15a which is the supporting portion 18, through the edge portion of the flat surface of the substrate 10.

In addition, for an explanation of the first excitation electrode 25a and the second excitation electrode 25b, the shapes and areas of the portions in contact with the lead electrodes 27a and 27b will be described, with an extending line (a virtual line) along the outer edge (outer side) of the excitation electrode as a boundary.

The embodiment illustrated in FIG. 1A is an example of a structure for drawing out the lead electrodes 27a and 27b, and the lead electrode 27a may pass through another thick portion. However, it is desirable that the lengths of the lead electrodes 27a and 27b be the shortest. It is desirable to suppress an increase in electrostatic capacitance by considering the lead electrodes 27a and 27b so as not to intersect across the substrate 10 in a plan view.

Further, with respect to the first excitation electrode 25a, the second excitation electrode 25b, the lead electrodes 27a and 27b, and the pad electrodes 29a and 29b, a film of nickel (Ni) is formed as a first layer which is a base layer from the substrate 10 side, and a film of gold (Au) which is a second layer is laminated and formed thereon, using a deposition apparatus, a sputtering apparatus, or the like. In addition, as electrode material, nichrome (NiCr) including nickel (Ni), or chromium (Cr) may be used as the first layer instead of nickel (Ni), and 18 gold or 14 gold including gold (Au), as well as silver (Ag) or platinum (Pt) may be used instead of gold (Au).

Figure 2:
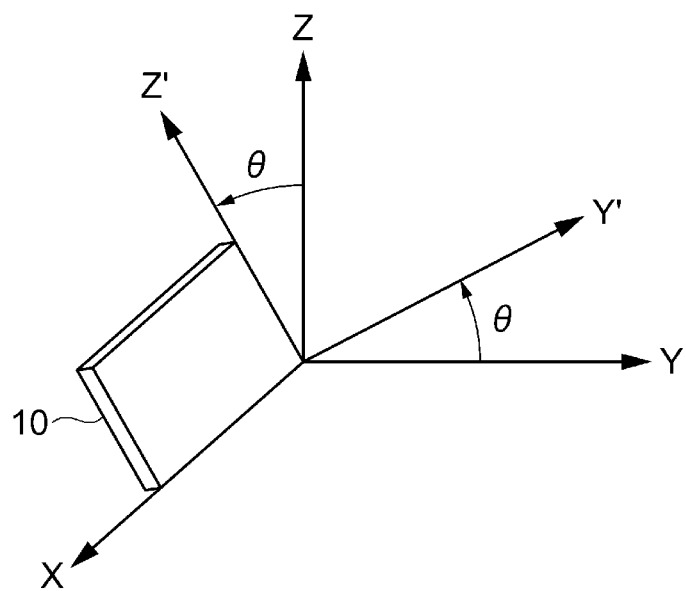
FIG. 2 is a diagram describing a relationship between a quartz crystal substrate and crystal axes.

A quartz crystal which is a piezoelectric material belongs to a trigonal system, and has crystal axes X, Y, and Z which are orthogonal to each other as illustrated in FIG. 2. The X axis, the Y axis, and the Z axis are respectively referred to as an electric axis, a mechanical axis, and an optical axis. Then, a rotation Y cut quartz crystal substrate obtained by cutting quartz crystal along a plane obtained by rotating an XZ plane about the X axis by a predetermined angle θ is used as the substrate 10. For example, in the case of the AT cut quartz crystal substrate, an angle θ is about 35° 15'. In addition, the axes which are obtained by rotating the Y axis and the Z axis about the X axis by θ are respectively referred to as a Y' axis and a Z' axis. Accordingly, the AT cut quartz crystal substrate has crystal axes X, Y', and Z' which are orthogonal to each other. The thickness direction of the AT cut quartz crystal substrate is the Y' axis, and an XZ' plane (a plane including the X axis and the Z' axis) orthogonal to the Y' axis is a main surface, and the AT cut quartz crystal substrate is excited by using the thickness shear vibration having displacement along the X-axis direction as the main vibration.

In other words, as illustrated in FIG. 2, the substrate 10 is the rotation Y cut quartz crystal substrate in which the X axis of an orthogonal coordinate system configured with the X axis (electric axis), the Y axis (mechanical axis), and the Z axis (optical axis) is a center, an axis obtained by inclining the Z axis in a −Y direction of the Y axis is set to the Z' axis, an axis obtained by inclining the Y axis in the +Z direction of the Z axis is set to the Y' axis, and a direction along the Y' axis is set to a thickness direction, and which is configured with a plane parallel to the X axis and the Z' axis.

Further, the substrate 10 according to the embodiment is not limited to the AT cut quartz crystal substrate having an angle θ of about 35° 15', but may be a BT cut quartz crystal substrate or the like which is excited in the thickness shear vibration mode at an angle θ of about −49°. Furthermore, a description has been made by using the example in which the thick portion is provided along the outer edge of the vibrating portion 12, but is not limited thereto, and although described in the subsequent modification example of the substrate shape, the present embodiment can be widely applied to a substrate in which a thick portion is provided along the outer edge of the entire circumference of the vibrating portion 12, or a substrate of a flat plate shape in which the thick portion is not provided.

Generally, in the thickness shear vibration mode, if a partial electrode is formed or a plate thickness difference is provided on the vibrating portion, it is possible to trap the vibration energy in the vicinity of that part, and obtain a stable resonant frequency. The resonant frequency of the trapping mode in this case is represent as a function of the energy trapping coefficient M obtained by the thickness ts of the vibrating portion, the film thickness to and the dimension hx of the excitation electrode.

The energy trapping coefficient M is represent by the following equation (1).

$$M = K \times (hx/2 \times ts) \times \sqrt{\Delta} \tag{1}$$

Here, K is an anisotropy coefficient of the vibrating portion (1.538 in a case of the AT cut quartz crystal substrate), hx is a dimension along the displacement direction of the thickness shear vibration of the excitation electrode, ts is a thickness of the vibrating portion, and Δ is a frequency decrease amount. In addition, when the shape of the excitation electrode is not a rectangle, but a shape such as a circle or an ellipse, the dimension of hx is set to be a maximum value among lengths along the displacement direction (X axis direction) of the thickness shear vibration mode.

In addition, the frequency decrease amount Δ is represented by the following equation (2).

$$\Delta = (fs-fe)/fs \quad (2)$$

Here, the fs is a cut-off frequency of the vibrating portion, fe is a frequency when the excitation electrode is formed on the entire surface of the vibrating portion.

In addition, when the shapes and the areas of the excitation electrodes on the front and back sides are identical, the cut-off frequency fs of the vibrating portion is represented by the following equation (3), and the frequency fe when the excitation electrode is formed on the entire surface of the vibrating portion is represented by the following equation (4).

$$fs = R/ts \quad (3)$$

$$fe = R/[ts + te \times (\rho e/\rho x)] \quad (4)$$

Here, R is a frequency integer of the vibrating portion, ts a thickness of the vibrating portion, te is a sum of thicknesses of the excitation electrodes on the front and back sides, ρe is densities of the excitation electrodes, and ρx is a density of the vibrating portion.

Generally, in the thickness shear vibration mode of the AT cut quartz crystal substrate, a condition for trapping a fundamental wave of a single mode is that the energy trapping coefficient M is 2.8 or less.

For example, in the AT cut quartz crystal resonator element that resonates at a resonant frequency of a 491 MHz band, when the dimensions hx of the first excitation electrode 25a and the second excitation electrode 25b are set to 0.30 mm, the film thicknesses of the excitation electrodes having the energy trapping coefficient M of 2.8 are significantly thin, about 1 nm, such that they are not able to be manufactured. For example, even if it is achievable, the CI value becomes very large due to the influence of ohmic loss caused by reducing the thickness of the electrode, and thus the oscillation in the oscillation circuit is not possible.

Then, if the electrode is formed in order to avoid the ohmic loss of the electrode film thickness at high frequencies (the film thickness is increased), the energy trapping coefficient M for trapping only the main vibration is significantly increased from 2.8, such that the spurious vibration of the inharmonic mode of a low order excluding the main vibration is unavoidably trapped. However, if the ratio between a minimum CI value of the trapped spurious vibration and the CI value of the main vibration is 1.8 or more, it can be said that oscillation is not theoretically possible at the spurious vibration of the inharmonic modes. Then, if the CI value of the main vibration is reduced to be 20Ω or less, and the CI value ratio between the main vibration and the spurious vibration is set to 2.0 or more in view of manufacturing variation, this satisfies the required specifications requested in the oscillation circuit, and thus it is possible to oscillate only the main vibration so as to make practical use possible.

Figure 3:
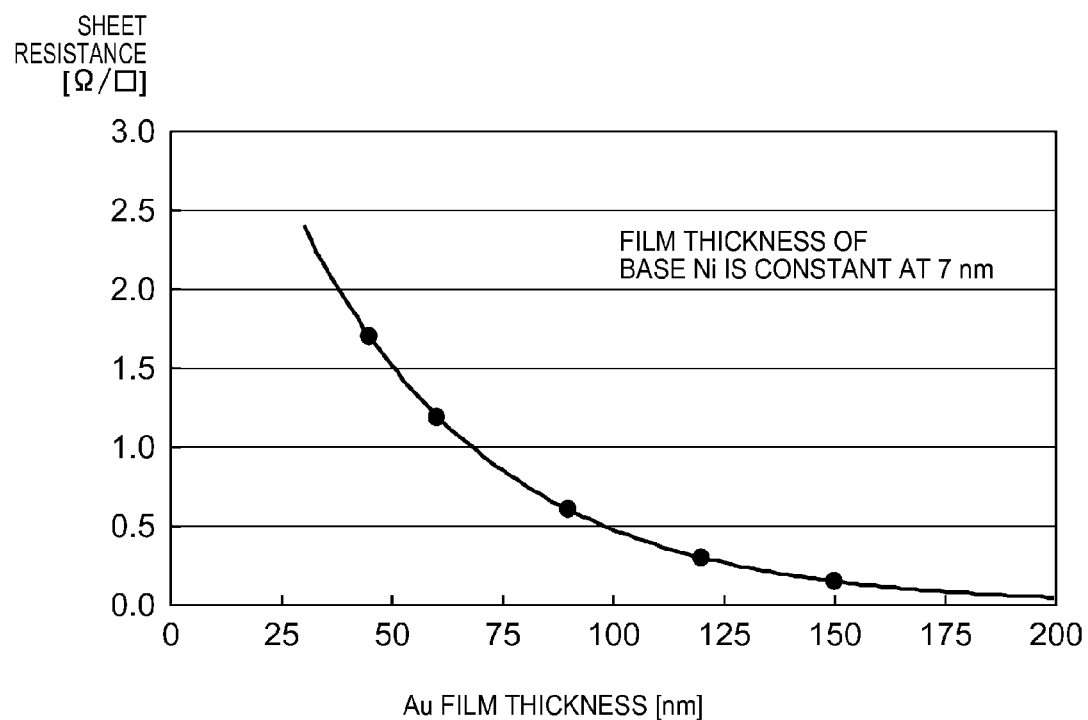
FIG. 3 is a diagram illustrating a sheet resistance with respect to a film thickness of an electrode.

FIG. 3 illustrates a sheet resistance value and a film thickness of gold (Au) with nickel (Ni) as a base layer. This is a measurement result of the sheet resistance when the film thickness of nickel (Ni) of the base layer is set to be constant at 7 nm, and the film thickness of gold (Au) is changed in a range of 45 nm to 150 nm. It is determined from FIG. 3 that if the film thickness becomes 90 nm or less, the sheet resistance is rapidly increased. Accordingly, in addition to the film thickness of the excitation electrode for determining the energy trapping coefficient M, it is necessary to increase the film thicknesses of the lead electrodes 27a and 27b and the pad electrodes 29a and 29b in order to reduce an increase in the CI value of the main vibration due to an influence of the ohmic loss. Especially, since the lead electrode portion is thinner and longer compared to the pad portion, the lead electrode portion is significantly affected by the ohmic loss. For example, in FIG. 3, when the length of the lead electrode portion is assumed to be 10 squares (the length of connecting squares), it is necessary to make the electrode film thickness be 150 nm or more at which the sheet resistance is 0.2 Ω/squares in order to make the resistance value of the lead electrode portion be 2Ω or less.

FIG. 4 represents an experimental production condition of a resonator element vibrating at a resonant frequency of a 491 MHz band, which is experimentally produced in the embodiment of FIGS. 1A to 1C and a characteristic result of a resonator.

The AT cut quartz crystal substrate is used as the substrate 10, and in the first excitation electrode 25a and the second excitation electrode 25b on the front and back sides, the thickness of the nickel (Ni) film which is the base layer is constant at 7 nm and the film thickness of gold (Au) is set to be in a range of 30 nm to 100 nm. If the hx is set to 0.18 mm and the hz is set to 0.14 mm, hx/hz is about 1.29, in the first excitation electrode 25a and the second excitation electrode 25b. In addition, hz is the dimension (length) along the direction orthogonal to the thickness shear vibration direction of the first excitation electrode 25a and the second excitation electrode 25b.

Further, in the lead electrodes 27a and 27b and the pad electrodes 29a and 29b on the front and back side, in order to decrease the influence of the ohmic loss, a nickel (Ni) film is laminated at a film thickness of 7 nm on the upper layer portion of the electrode layer formed with the same thickness as those of the first excitation electrode 25a and the second excitation electrode 25b, and a gold (Au) film is laminated at a film thickness of 200 nm on the nickel film.

In addition, after the experimentally produced resonator element 1 is mounted on a package, that will be described later, and sealed, the characteristics as the resonator are measured.

Here, the experimental production conditions represented in FIG. 4 satisfy the above-described equations (1), (2), (3), and (4).

In addition, respective parameters are as follows.
K=1.538
R=1.67 (MHz·mm)
ρx=2.649 (g/cm³)
ρAu (density of gold)=19.3 (g/cm³)
ρNi (density of nickel)=8.9 (g/cm³)

The density ρe of the excitation electrode formed with a two-layer structure is calculated by the following expression (5).

$$\rho e = (\rho Au \times tAu + \rho Ni \times tNi)/(tAu + tNi) \quad (5)$$

Here, tAu is the thickness of gold (Au) which is the second layer, and tNi is the thickness of nickel (Ni) which is the first layer as a base layer.

fs is a cut-off frequency of the vibrating portion 12, fe is a frequency when the first excitation electrode 25a and the second excitation electrode 25b are disposed on the vibrating portion 12.

Figure 5:
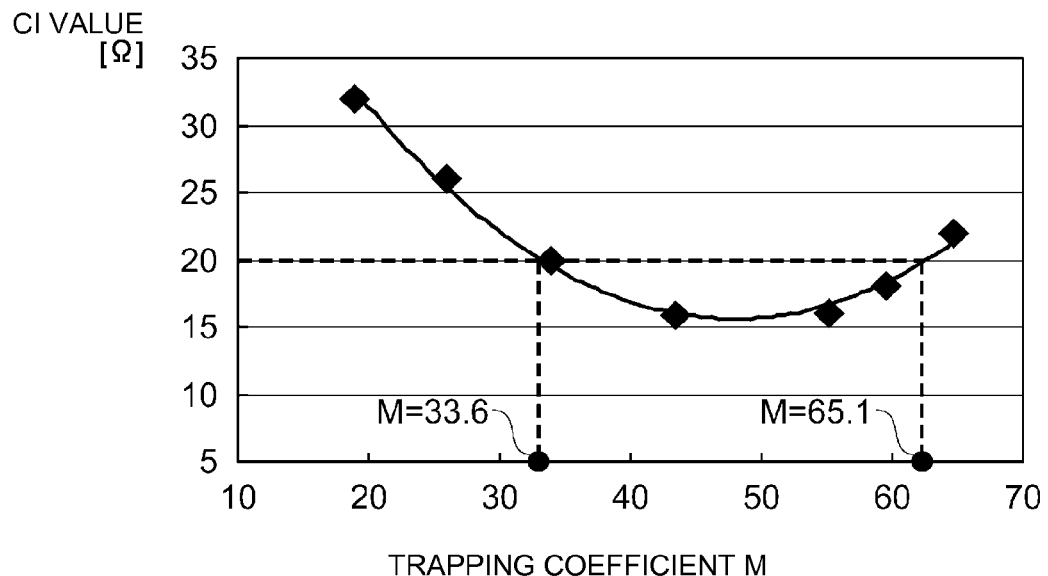
FIG. 5 is a diagram representing a CI value of the resonator with respect to an energy trapping coefficient M of the resonator element.

FIG. 5 illustrates a CI value of the resonator with respect to the energy trapping coefficient M of the resonator element illustrated in FIG. 4. FIG. 5 illustrates a tendency that if the energy trapping coefficient M is increased, the CI value decreases first, and thereafter, the CI value increases again. This is considered that since the electrode film thickness is increased, the influence of ohmic loss is reduced, and thereafter, since the electrode film thickness is further increased, the resistance is increased because a load is applied to the vibration of the vibrating portion 12 by the weight of the electrode.

Accordingly, from FIG. 5, it is possible to satisfy the specification (CI≤20Ω) of the CI value that is required by the oscillation circuit, by setting the energy trapping coefficient M to be in a range of 33.6 or more and 65.1 or less.

Figure 6:
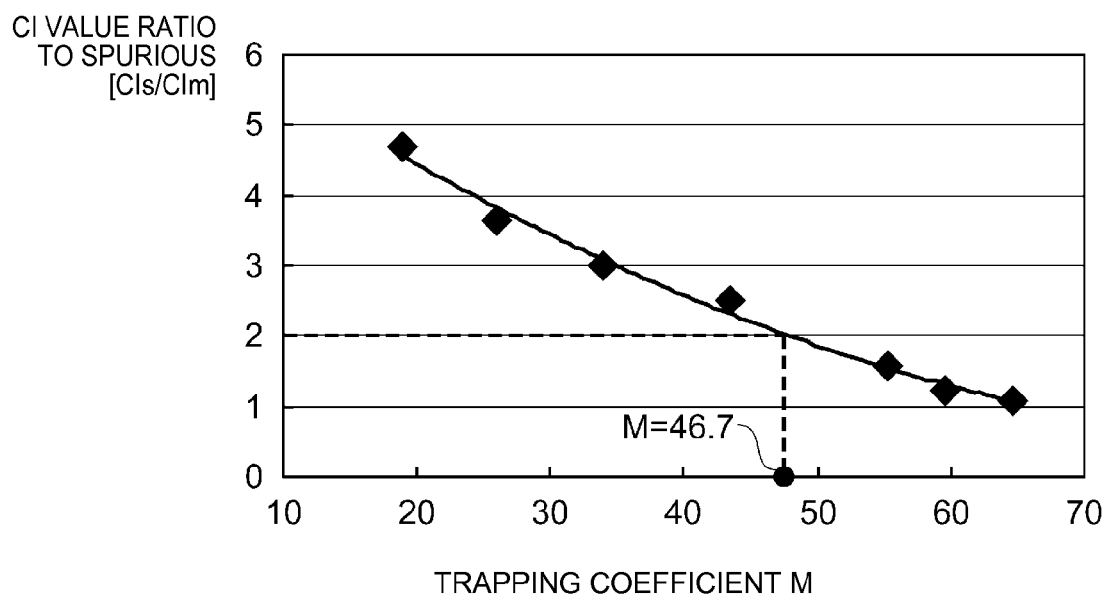
FIG. 6 is a diagram representing a CI value ratio between a main vibration CI value and a spurious CI value of the resonator with respect to the energy trapping coefficient M of the resonator element.

FIG. 6 illustrates the CI value ratio (CIs/CIm) between the CI value (CIm) of the main vibration of the resonator and the CI value (CIs) of the spurious, with respect to the energy trapping coefficient M of the resonator element illustrated in FIG. 4. It is considered that a tendency of the CI value ratio (CIs/CIm) being reduced at the time of the energy trapping coefficient M being increased is because that the film thickness of the excitation electrode is increased and thus the spurious vibration in the inharmonic mode is strongly trapped.

From FIG. 6, it is determined to satisfy the specification of the spurious vibration (CIs/CIm≥2.0) required by the oscillation circuit, by setting the energy trapping coefficient M to be 46.7 or less.

From the above results, when the shapes and the areas of the first excitation electrode 25a and the second excitation electrode 25b on the front and back sides are the same, it is determined that when the energy trapping coefficient M is in a range of 33.6≤M≤46.7, it is possible to simultaneously satisfy the specification of the CI value (CI≤20Ω) required by the oscillation circuit and the specification of the spurious vibration (CIs/CIm≥2.0).

Modification Example of Excitation Electrode Shape

Figure 7C:
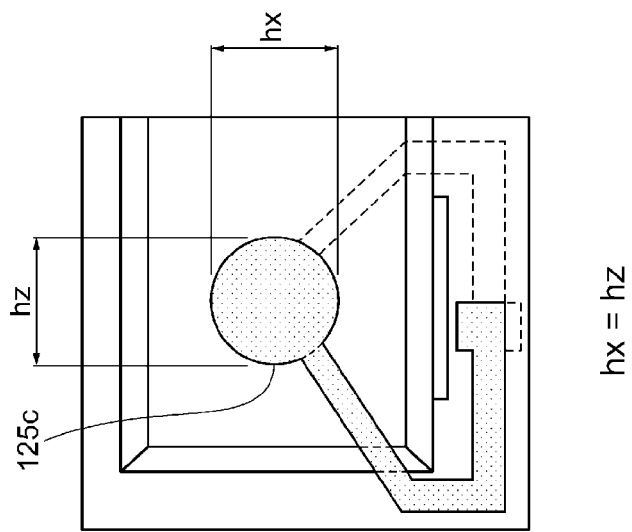
FIGS. 7A to 7C are schematic diagrams illustrating modification examples of the excitation electrode shape of the resonator element according to the embodiment of the invention.
Figure 7B:
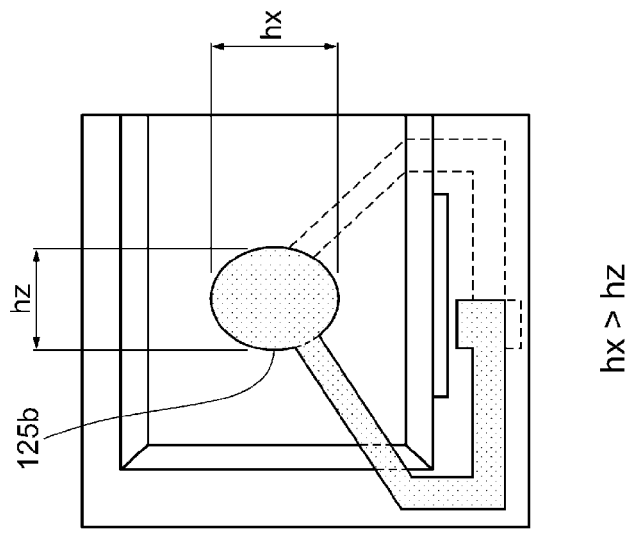
Figure 7A:
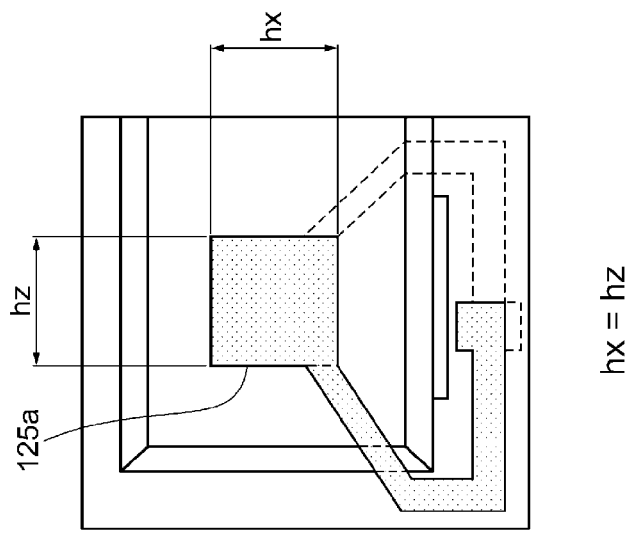

FIGS. 7A to 7C are schematic diagrams illustrating modification examples of the excitation electrode shape of the resonator element according to the embodiment of the invention, FIG. 7A is a plan view of Modification Example 1, FIG. 7B is a plan view of Modification Example 2, and FIG. 7C is a plan view of Modification Example 3.

The embodiment illustrated in FIGS. 1A to 1C represents the example in which the shapes of the first excitation electrode 25a and the second excitation electrode 25b are rectangles (a long side is in the X direction), but does not need to be limited thereto. As illustrated in FIG. 7A to FIG. 7C, the shapes of the excitation electrodes 125a, 125b, and 125c may be square, elliptical (a radius is long in the X direction), or circular.

In addition, in a case of the thickness shear vibration mode using the AT cut quartz crystal substrate, it is said that the displacement distribution of the displacement direction determined by the anisotropy of the crystal and the displacement distribution in the direction perpendicular thereto are different and the electrode dimension ratio (hx/hz) of about 1.28 is most efficient, the capacitance ratio γ of the AT cut quartz crystal resonator (=C0/C1, here, C0 is a parallel capacitance, and C1 is an equivalent serial capacitance) can be at a minimum in an elliptical or a rectangular excitation electrode shape having that ratio. Further, it is expected that the manufacturing variation or the front and back alignment error of the dimensions (hx and hz) of the first excitation electrode 25a and the second excitation electrode 25b is a dimension ratio of about ±2% (about ±4 μm, when hx=0.18 mm), and thus it is preferable that the electrode dimension ratio (hx/hz) be in a range of 1.25 to 1.31 with 1.28 as a center.

Modification Example of Substrate Shape

FIGS. 8A to 12B are schematic diagrams illustrating modification examples of the substrate shape of the resonator element according to the embodiment of the invention, FIGS. 8A, 9A, 10A, 11A, and 12A are plan views of the respective modification examples 1 to 5, and FIGS. 8B, 9B, 10B, 11B, and 12B are sectional views of the respective modification examples 1 to 5.

Figure 8A:
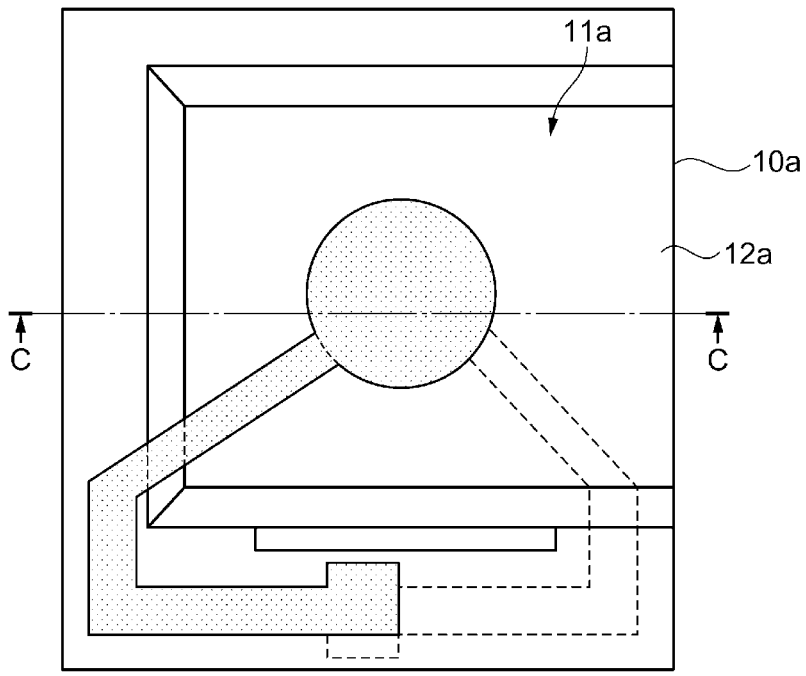
FIGS. 8A and 8B are schematic diagrams illustrating modification examples of the substrate shape of the resonator element according to the embodiment of the invention.
Figure 8B:
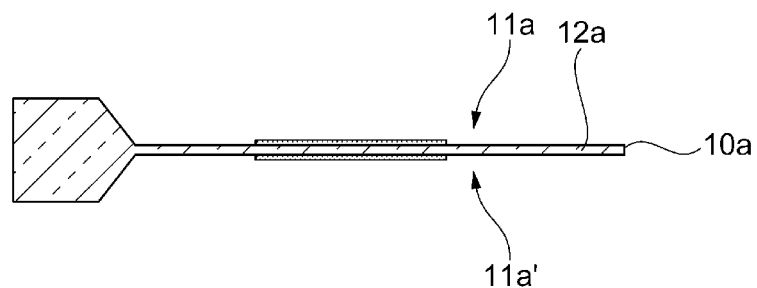
Figure 9A:
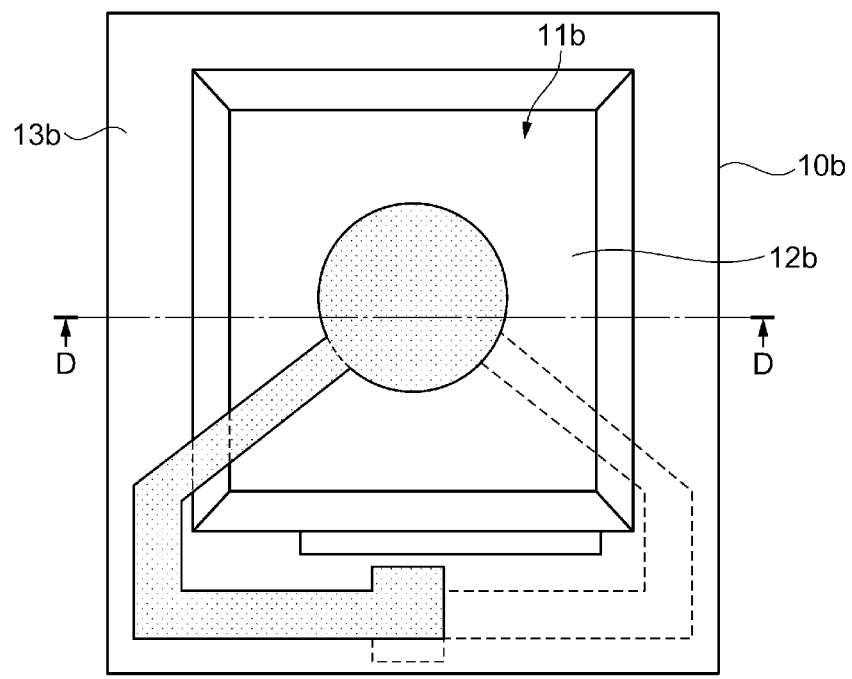
FIGS. 9A and 9B are schematic diagrams illustrating modification examples of the substrate shape of the resonator element according to the embodiment of the invention.
Figure 9B:
Figure 10A:
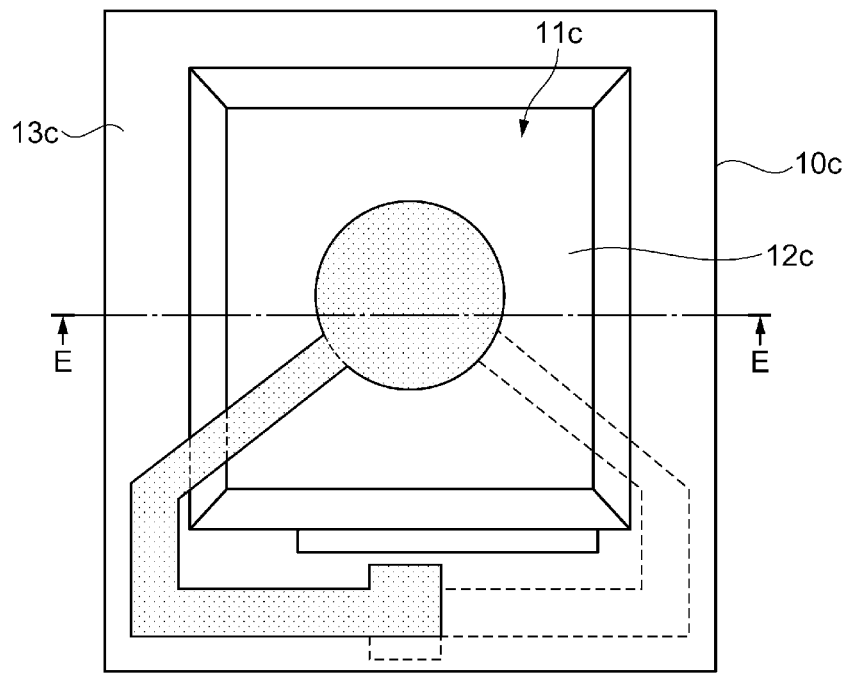
FIGS. 10A and 10B are schematic diagrams illustrating modification examples of the substrate shape of the resonator element according to the embodiment of the invention.
Figure 10B:
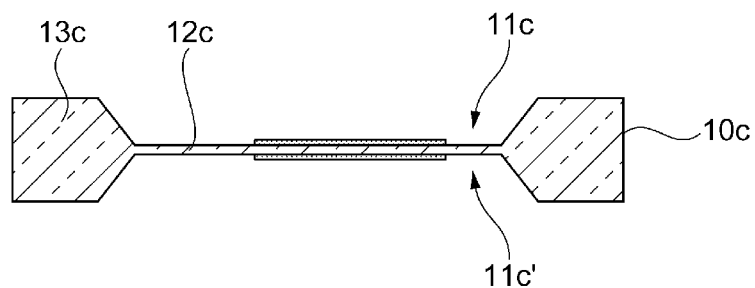

As the shape of the substrate 10, the substrate 10 is used in which one main surface has a concave portion 11 and the other main surface is a flat surface, but as illustrated in FIGS. 8A and 8B, a substrate 10a having concave portions 11a and 11a' on both main surfaces of the vibrating portion 12a may be used.

Further, as illustrated in FIGS. 9A and 9B and FIGS. 10A and 10B, a substrate 10b having a concave portion 11b surrounded by a thick portion 13b on one main surface of the vibrating portion 12b, and a substrate 10c having concave portions 11c and 11c' surrounded by a thick portion 13c on the both main surfaces of the vibrating portion 12c may be used.

Figure 11A:
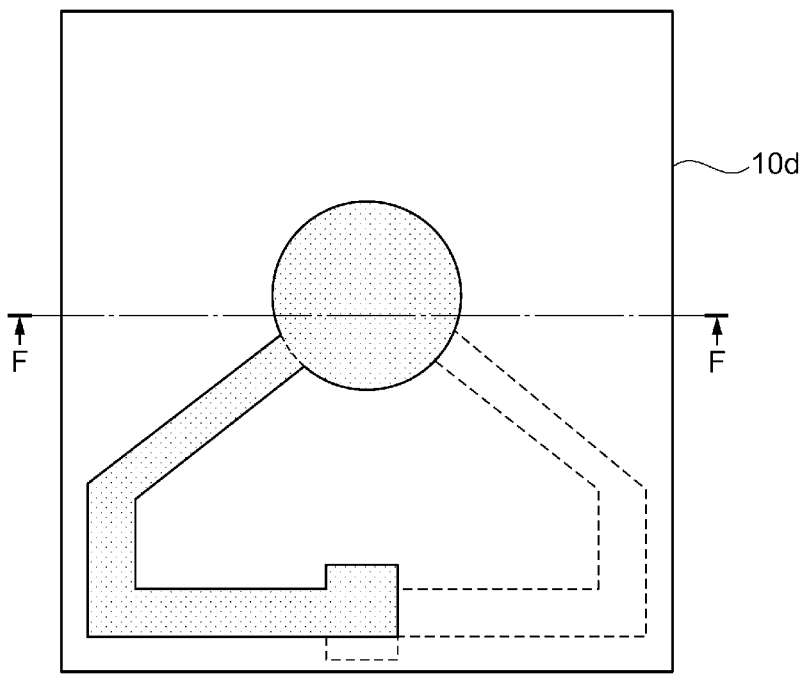
FIGS. 11A and 11B are schematic diagrams illustrating modification examples of the substrate shape of the resonator element according to the embodiment of the invention.
Figure 11B:
Figure 12A:
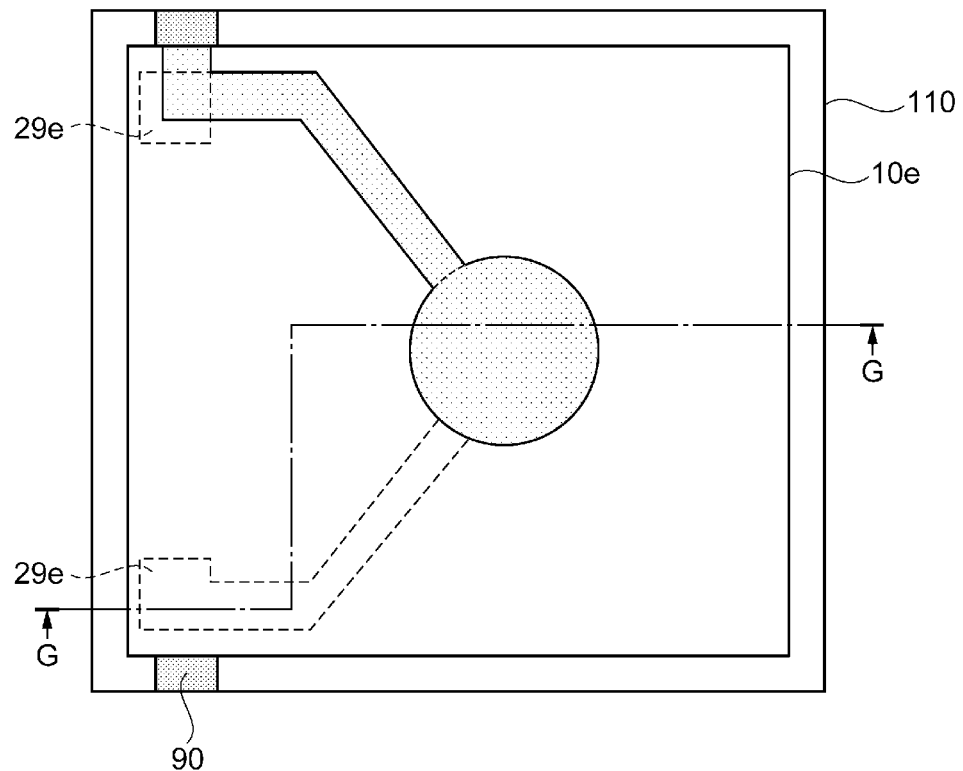
FIGS. 12A and 12B are schematic diagrams illustrating modification examples of the substrate shape of the resonator element according to the embodiment of the invention.
Figure 12B:
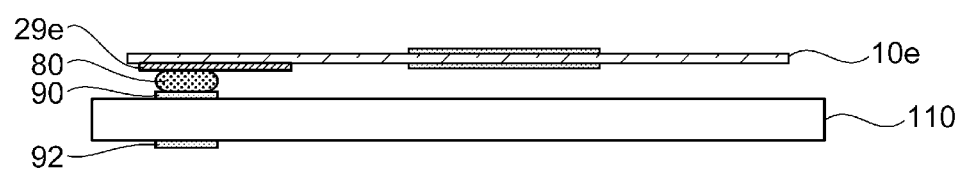

Further, as illustrated in FIGS. 11A and 11B, a substrate 10d of a flat shape may be used. In addition, if the substrate 10d has a flat shape, it is very thin, so there is a risk of breakage when it is handled or mounted on a package. Therefore, in order to improve the strength, a substrate 10e of a flat shape may be configured to be mounted on a thick supporting substrate 110, as illustrated in FIGS. 12A and 12B.

First, a pad electrode 29e provided on the substrate 10e and a pad electrode 90 provided on one main surface of the supporting substrate 110 are joined with a conductive joining member 80 such that electrical conduction in this configuration is achieved. Next, the pad electrode 29e of the substrate 10e and an element mounting pad of a package can be electrically conducted, by attaching the mounting electrode 92, which is provided on the other main surface of the supporting substrate 110 electrically connected to the pad electrode 90 of the supporting substrate 110 by the side electrodes (not shown) and the like, to the element mounting pad of the package through a conductive joining member or the like.

Resonator

Next, a resonator 2 to which the resonator element 1 described above is applied (resonator according to the invention) will be described.

Figure 13A:
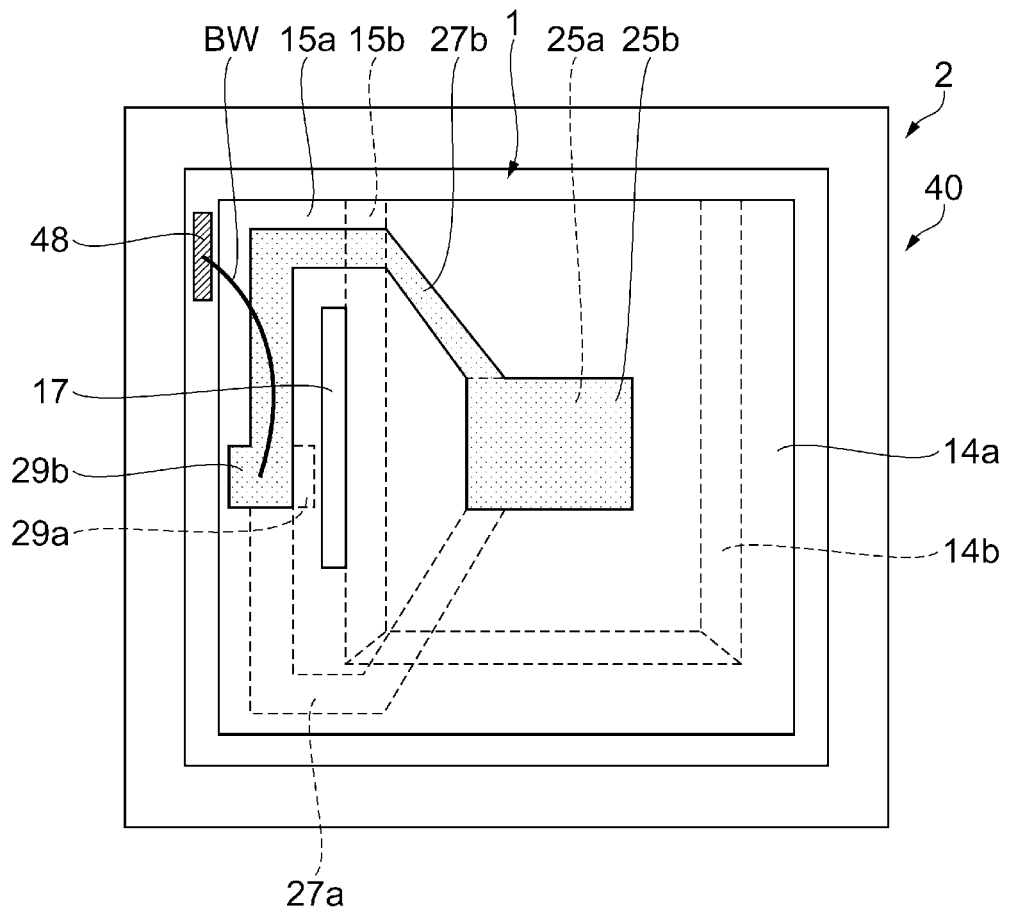
FIGS. 13A and 13B are schematic diagrams illustrating a structure of a resonator according to the embodiment of the invention.
Figure 13B:
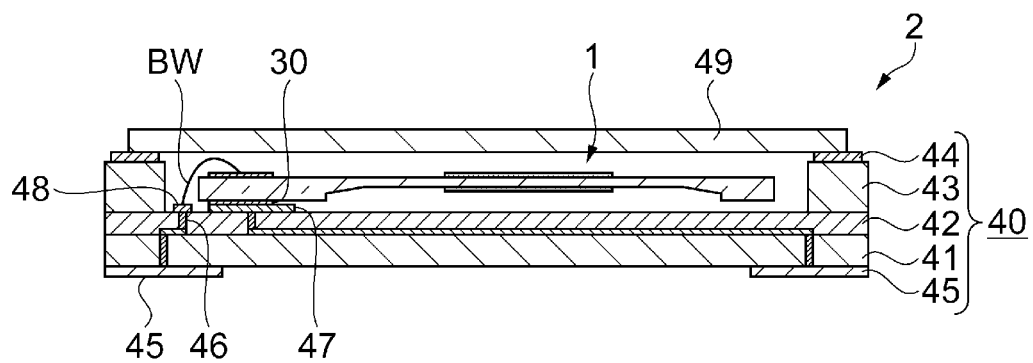

FIGS. 13A and 13B are diagrams illustrating a configuration of a resonator according to an embodiment of the invention, FIG. 13A is a plan view in which a cover member is omitted, and FIG. 13B is a longitudinal sectional view. The resonator 2 is configured to include the resonator element 1, a package body 40 formed into a rectangular box shape for accommodating the resonator element 1, and a cover member 49 made from metal, ceramic, glass or the like.

As illustrated in FIG. 13B, the package body 40 is formed by laminating a first substrate 41, a second substrate 42, a third substrate 43, a seal ring 44, and a mounting terminal 45. A plurality of mounting terminals 45 are formed on an outer bottom surface of the first substrate 41. The third substrate 43 is formed into an annular shape in which the center portion is removed, and for example, a seal ring 44 such as Kovar is formed on the upper peripheral edge of the third substrate 43.

A recess (cavity) accommodating the resonator element 1 is formed of the third substrate 43 and the second substrate 42. A plurality of element mounting pads 47 which are electrically conducted to the mounting terminals 45 by the conductors 46 are provided in a predetermined position on the upper surface of the second substrate 42. The element mounting pad 47 is arranged so as to correspond to the pad electrode 29a formed on the second thick main body 15a when the resonator element 1 is placed.

When fixing the resonator element 1, first, the resonator element 1 is inverted (upside down) and the pad electrode 29a is placed on the element mounting pad 47 to which a conductive adhesive 30 has been applied so as to apply a load. A polyimide-based adhesive with low outgassing is used as the conductive adhesive 30, in view of a change over time.

Next, the resonator element 1 is put in a high-temperature furnace at a predetermined temperature for a predetermined period of time in order to cure the conductive adhesive 30 of the resonator element 1 mounted on the package body 40. After curing the conductive adhesive 30, the pad electrode 29b which is the upper surface of the inverted resonator element 1 and the electrode terminal 48 of the package body 40 are conductively connected by the bonding wire BW. As illustrated in FIG. 13B, since a portion of supporting and fixing the resonator element 1 to the package body 40 is located at one place (one point), it is possible to reduce the size of the mounting stress caused by the supporting and fixing.

After an annealing process for mitigating an implementation distortion is performed, the frequency adjustment is performed by adding the mass to the second excitation electrode 25b, or reducing the mass of the second excitation electrode 25b. Thereafter, the resonator 2 is completed by placing the cover member 49 on the seal ring 44 formed on the upper surface of the package body 40, and sealing the cover member 49 through seam welding at a reduced pressure atmosphere or an atmosphere of inert gas such as nitrogen gas. Otherwise, there is a method of placing and attaching the cover member 49 through melting to glass with a low-melting point which has been applied on the upper surface of the third substrate 43 of the package body 40. Also in this case, the resonator 2 is completed by making an inside of the cavity of the package be a reduced pressure atmosphere or filling the cavity with inert gas such as nitrogen gas.

The resonator element 1 in which the pad electrodes 29a and 29b are separated by a distance in the Z' axis direction may be configured. Even in this case, it is possible to configure the resonator similarly to the resonator 2 described in FIGS. 13A and 13B. Further, the resonator element 1 in which the pad electrodes 29a and 29b are formed while being separated by a distance on the same surface may be configured. In this case, the resonator element 1 has a configuration in which a conductive adhesive 30 has been applied on two places (two points) for achieving conduction, supporting and fixing. Although the structure is suitable for reducing height, there is a concern that the mounting stress caused by the conductive adhesive 30 is slightly increased.

Although an example of using laminated plates in the package body 40 has been described in the embodiment of the above resonator 2, the resonator may be configured by using a single-layer ceramic plate as the package body 40 and a cap that has been subjected to a squeezing process as the cover.

As illustrated in FIGS. 13A and 13B, the portion of supporting the resonator element 1 is located at one point, and a slit 17 is provided between the supporting portion 18 and the vibrating portion 12, this allows mounting stress caused by the conductive adhesive 30 to be reduced, and thus there is an effect of achieving a resonator 2 with excellent frequency reproducibility, a frequency-temperature characteristic, a CI-temperature characteristic, and a frequency aging characteristic.

Electronic Device

Next, an electronic device 3 employing the resonator element 1 according to the invention (an electronic device according to the invention) will be described.

Figure 14A:
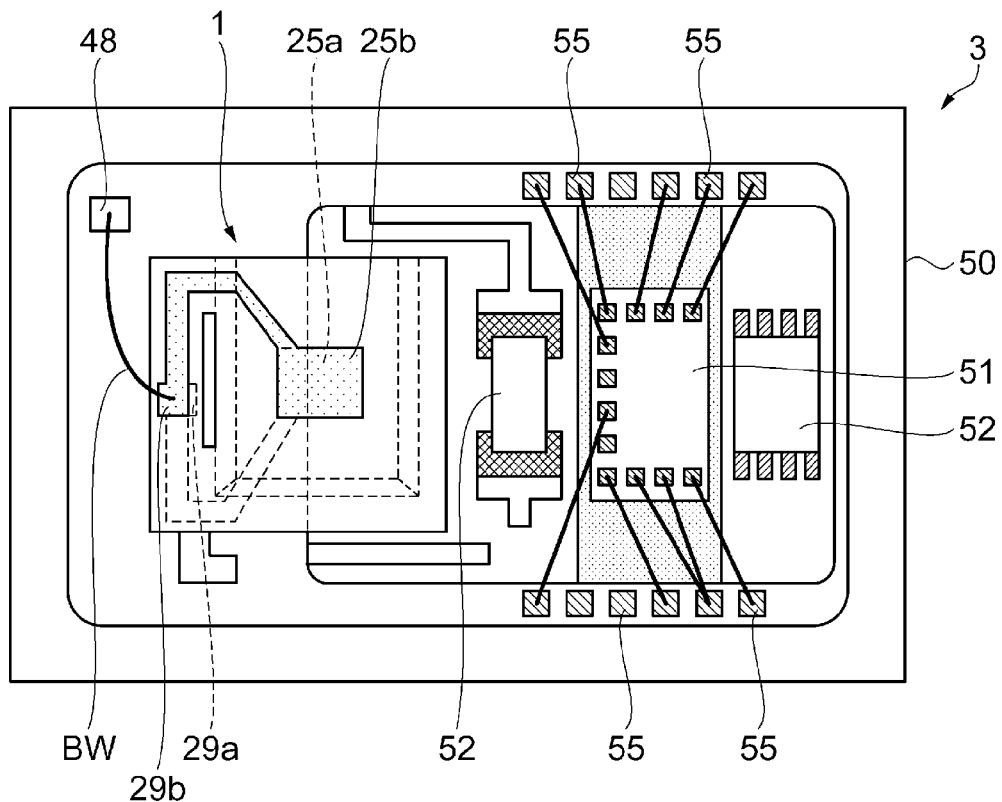
FIGS. 14A and 14B are schematic diagrams illustrating a structure of an electronic device according to the embodiment of the invention.
Figure 14B:
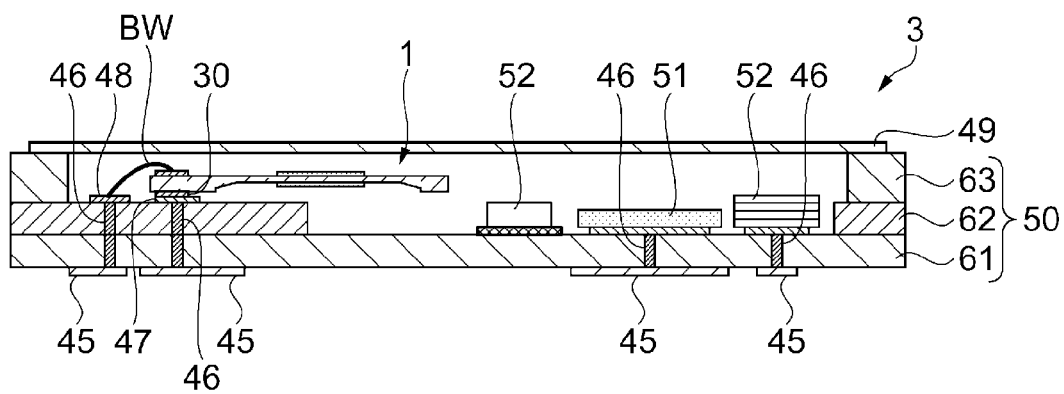

FIGS. 14A and 14B are diagrams illustrating a configuration of an electronic device according to an embodiment of the invention, FIG. 14A is a plan view in which a cover member is omitted, and FIG. 14B is a longitudinal sectional view of FIG. 14A. The electronic device 3 includes a package body 50, a cover member 49, the resonator element 1, an IC component 51 equipped with an oscillation circuit that excites the resonator element 1, and at least one of electronic components 52 such as a variable capacitor in which capacitance is changed by a voltage, a thermistor in which a resistance is changed depending on a temperature, and an inductor.

The package body 50, as illustrated in FIGS. 14A and 14B, is formed by laminating a first substrate 61, a second substrate 62, and a third substrate 63. A plurality of mounting terminals 45 are provided on an outer bottom surface of the first substrate 61. The second substrate 62 and the third substrate 63 are formed into an annular shape in which the center portion is removed.

A recess (cavity) accommodating the resonator element 1, the IC component 51, the electronic component 52, and the like is formed by the first substrate 61, the second substrate 62, and the third substrate 63. A plurality of element mounting pads 47 which are electrically conducted to the mounting terminals 45 by the conductors 46 are provided in a predetermined position on the upper surface of the second substrate 62. The element mounting pad 47 is arranged so as to correspond to the pad electrode 29a formed on the second thick main body 15a when the resonator element 1 is placed.

The conduction between the pad electrode 29a and the element mounting pad 47 is achieved by placing the pad electrode 29a of the inverted resonator element 1 on the element mounting pad 47 of the package body 50 which has been applied with a conductive adhesive (polyimide-based) 30. The conduction to one electrode terminal 55 of the IC component 51 through a conductor (not shown) formed between the substrates of the package body 50 is achieved by connecting the pad electrode 29b which is an upper surface of the inverted resonator element 1 and the electrode terminal 48 of the package body 50 through a bonding wire BW. The IC component 51 is fixed in a predetermined position of the package body 50, and the terminal of the IC component 51 and the electrode terminal 55 of the package body 50 are connected by the bonding wire BW. Further, the electronic component 52 is placed in a predetermined position of the package body 50, and is connected to the conductor 46 by using a metal bump. The electronic device 3 is completed by making the package body 50 be a reduced pressure atmosphere or filling the package body 50 with inert gas such as nitrogen, and sealing the package body 50 with the cover member 49.

In a method of connecting the pad electrode 29b and the electrode terminal 48 of the package body 50 through the bonding wire BW, a portion supporting the resonator element 1 is located at one place (one point), and the mounting stress due to the conductive adhesive 30 can be reduced.

There is an effect of achieving a voltage-controlled oscillator in which the capacitance ratio is reduced, the frequency variable width is wide, and which has a good S/N ratio, by using the resonator element 1 of a high frequency that is excited by a fundamental wave, by configuring the electronic device 3 as illustrated in FIGS. 14A and 14B.

Further, it is possible to configure an oscillator and a temperature compensated oscillator as the electronic device 3, and there is an effect of being capable of configuring an oscillator with excellent frequency reproducibility, an aging characteristic, and a frequency-temperature characteristic.

Electronic Apparatus

Subsequently, an electronic apparatus to which the resonator element 1 according to an embodiment of the invention is applied (an electronic apparatus according to the invention) will be described in detail based on FIG. 15 to FIG. 17.

Figure 15:
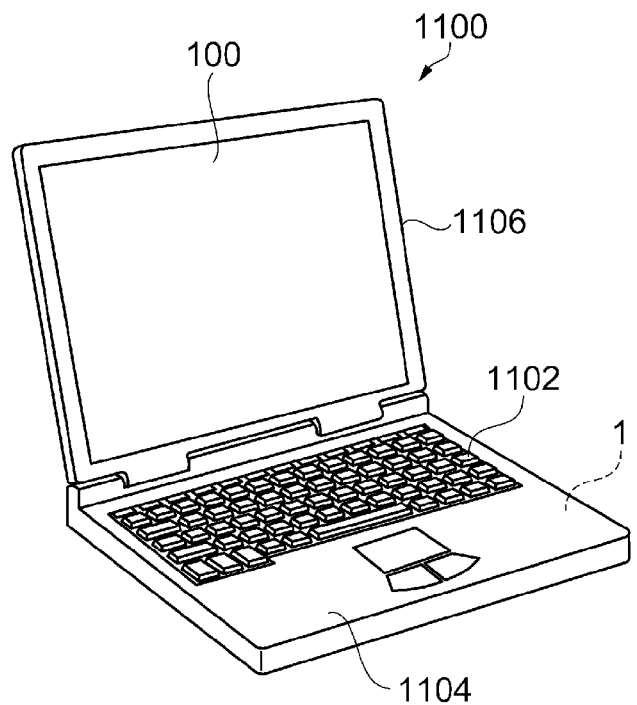
FIG. 15 is a perspective view illustrating a configuration of a mobile (notebook) type personal computer to which the electronic apparatus including the resonator element according to the embodiment of the invention is applied.

FIG. 15 is a perspective view illustrating a configuration of a mobile type (notebook type) personal computer which is an electronic apparatus including the resonator element according to the embodiment of the invention. In FIG. 15, the personal computer 1100 is configured to include a main body unit 1104 having a keyboard 1102 and a display unit 1106 having a display 100, and the display unit 1106 is rotatably supported to the main body unit 1104 through a hinge structure. The resonator element 1 functioning as a filter, a resonator, and a reference clock is built into the personal computer 1100.

Figure 16:
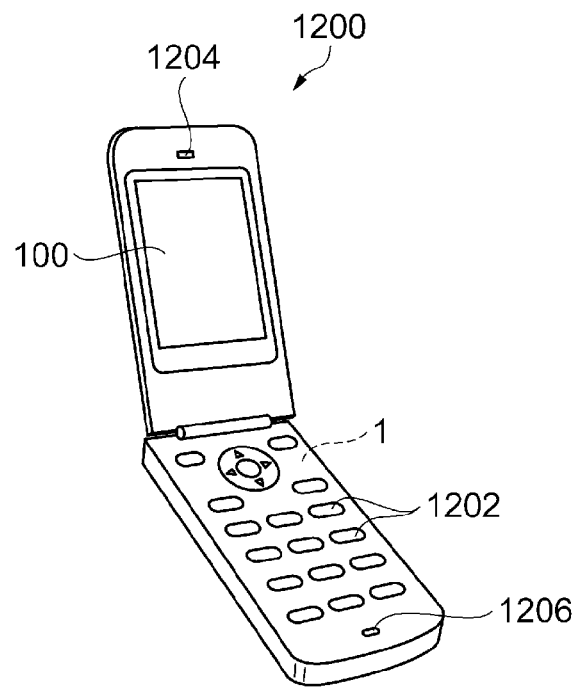
FIG. 16 is a perspective view illustrating a configuration of a mobile phone (including a PHS) to which the electronic apparatus including the resonator element according to the embodiment of the invention is applied.

FIG. 16 is a perspective view illustrating a configuration of a mobile phone (including a PHS) which is an electronic apparatus including the resonator element according to the embodiment of the invention. In FIG. 16, the mobile phone 1200 includes a plurality of operation buttons 1202, an earpiece 1204, and a mouthpiece 1206, and a display 100 is disposed between the operation button 1202 and the earpiece 1204. The resonator element 1 functioning as a filter and a resonator is built into the mobile phone 1200.

Figure 17:
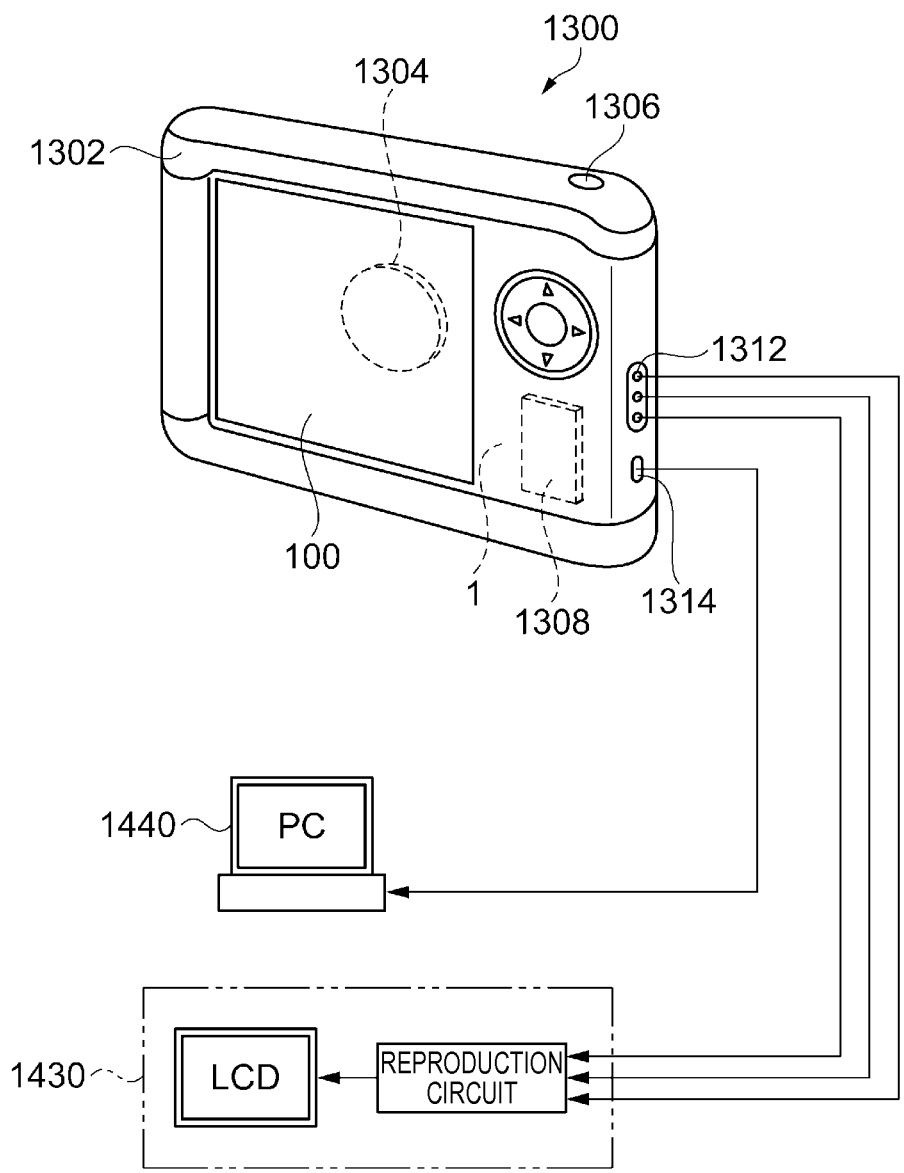
FIG. 17 is a perspective view illustrating a configuration of a digital camera to which the electronic apparatus including the resonator element according to the embodiment of the invention is applied.

FIG. 17 is a perspective view illustrating a configuration of a digital camera which is an electronic apparatus including the resonator element according to the embodiment of the invention. In addition, in FIG. 17, the connection to external devices is briefly illustrated. Whereas a common camera exposes a silver halide photographic film with an optical image of an object, a digital camera 1300 generates an imaging signal (image signal) by photo-electrically converting an optical image of an object by using an imaging device such as a Charge Coupled Device (CCD).

The display 100 is provided on a rear surface of a case (body) 1302 of the digital camera 1300 and is configured to perform display based on the imaging signal by the CCD. The display 100 functions as a viewfinder that displays the object as an electronic image. Further, a light receiving unit 1304 including optical lenses (an imaging optical system) and a CCD is provided on the front surface side (the back surface side in FIG. 17) of the case 1302.

If a photographer checks an object image displayed on the display 100 and presses a shutter button 1306, the imaging signal of the CCD at this time is transmitted to and stored in a memory 1308. Further, in the digital camera 1300, a video signal output terminal 1312 and an input-output terminal 1314 for data communication are provided on the side surface of the case 1302. Then, as illustrated, a television monitor 1430 is to be connected to the video signal output terminal 1312 and a personal computer 1440 is to be connected to the input-output terminal 1314 for data communication respectively, as necessary. Further, the imaging signal stored in the memory 1308 is output to the television monitor 1430 or the personal computer 1440 by a predetermined operation. The resonator element 1 functioning as a filter and a resonator is built into the digital camera 1300.

In addition to the personal computer 1100 (mobile type personal computer) of FIG. 15, the mobile phone 1200 of FIG. 16, and the digital camera 1300 of FIG. 17, the example of the electronic apparatus including the resonator element 1 according to the embodiment of the invention includes, an ink jet ejection device (for example, an ink jet printer), a laptop type personal computer, a television, a video camera, a video recorder, a car navigation device, a pager, an electronic organizer (including a communication function), an electronic dictionary, a calculator, an electronic game machine, a word processor, a workstation, a video phone, a security television monitor, electronic binoculars, a POS terminal, medical equipment (for example, an electronic thermometer, a blood pressure meter, a blood glucose meter, an electrocardiogram measuring device, an ultrasonic diagnostic apparatus, an electronic endoscope), a fish group finder, various measurement equipment, a gauge (for example, gauges of a vehicle, an aircraft, and a ship), a flight simulator, and the like.

Moving Object

Next, a moving object to which the resonator element 1 according to an embodiment of the invention is applied (a moving object according to the invention) will be described.

Figure 18:
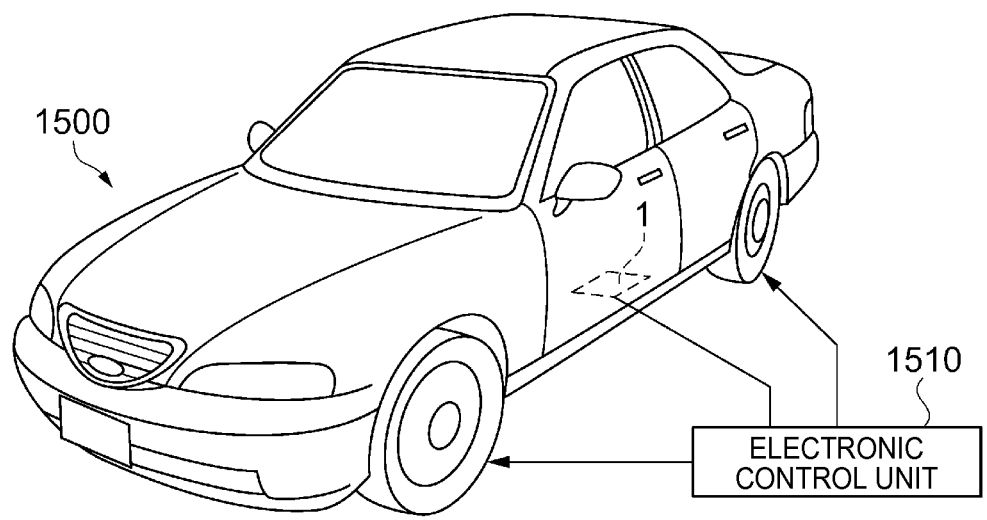
FIG. 18 is a perspective view schematically illustrating a vehicle which is an example of a moving object including the resonator according to the embodiment of the invention.

FIG. 18 is a perspective view schematically illustrating a vehicle which is an example of a moving object according to the invention. A vehicle 1500 is equipped with the resonator element 1 according to an embodiment of the invention. The resonator element 1 can be widely applied to an electronic control unit (ECU) 1510 of a keyless entry, an immobilizer, a car navigation system, a car air conditioner, an anti-lock brake system (ABS), an airbag, a tire-pressure monitoring system (TPMS), an engine controller, a battery monitor of a hybrid vehicle or an electric vehicle, a vehicle body attitude control system, and the like.

Hitherto, the resonator element 1, the resonator 2, the electronic device 3, the electronic apparatus and the moving object according to the invention have been described based on the illustrated embodiments, but the invention is not limited thereto, and the configuration of each unit may be replaced with any configuration having a similar function. Further, other arbitrary components may be added to the invention. Further, the respective embodiments described above may be appropriately combined.

The entire disclosure of Japanese Patent Application No. 2013-225044, filed Oct. 30, 2013 is expressly incorporated by reference herein.

What is claimed is:

1. A resonator element comprising:
   a vibrating portion that vibrates in a thickness shear vibration and includes a first main surface and a second main surface which are in a front and back relationship to each other;
   a first excitation electrode that is provided on the first main surface; and
   a second excitation electrode that is provided on the second main surface,
   wherein an energy trapping coefficient M, a frequency decrease amount $\Delta$, a cut-off frequency fs, and a frequency fe satisfy relationships of $33.6 \le M \le 65.1,$ $M = K \times (hx/2 \times ts) \times \sqrt{\Delta},$ $\Delta = (fs - fe)/fs,$ $fs = R/ts,$ and $fe = R/[ts + te \times (\rho e/\rho x)],$ where M is an energy trapping coefficient, K is an anisotropy coefficient of the vibrating portion, hx is a length along the thickness shear vibration direction of the first excitation electrode and the second excitation electrode, ts is a thickness of the vibrating portion, Δ is a frequency decrease amount, fs is a cut-off frequency of the vibrating portion, fe is a frequency when the first excitation electrode and the second excitation electrode are disposed in the vibrating portion, R is a frequency integer of the vibrating portion, te is a sum of the thicknesses of the first excitation electrode and the second excitation electrode, ρe is densities of the first excitation electrode and the second excitation electrode, and ρx is a density of the vibrating portion.

2. The resonator element according to claim 1, wherein the energy trapping coefficient M satisfies a relationship of 33.6 M 46.7.

3. The resonator element according to claim 1, wherein the vibrating portion is a quartz crystal substrate.

4. The resonator element according to claim 3, wherein the quartz crystal substrate is an AT cut quartz crystal substrate.

5. The resonator element according to claim 1, wherein when the length along the direction orthogonal to the thickness shear vibration direction of the first excitation electrode and the second excitation electrode is set to hz, a relationship of $1.25 \le hx/hz \le 1.31$ is satisfied.

6. The resonator element according to claim 1, wherein the first excitation electrode and the second excitation electrode are respectively formed of a two-layer structure in which a first layer and a second layer are laminated in this order from the vibrating portion side, wherein the first layer includes nickel (Ni), and wherein the second layer includes gold (Au).

7. A resonator comprising:
the resonator element according to claim 1; and
a package that accommodates the resonator element.

8. An electronic device comprising:
the resonator element according to claim 1; and
a circuit.

9. An electronic apparatus comprising:
the resonator element according to claim 1.

10. A moving object comprising:
the resonator element according to claim 1.

* * * * *